Dec. 16, 1969 E. D. WOLLEY 3,484,854

PROCESSING SEMICONDUCTOR MATERIALS

Filed Oct. 17, 1966 2 Sheets-Sheet 1

WITNESSES:

Bernard R. Gieguez

Donald M. Winegar

INVENTOR

Elden D. Wolley

BY

C. L. Menzemer

ATTORNEY

United States Patent Office 3,484,854
Patented Dec. 16, 1969

3,484,854

PROCESSING SEMICONDUCTOR MATERIALS

Elden D. Wolley, Monroeville, Pitcairn, Pa., assignor to Westinghouse Electric Corporation, Pittsburgh, Pa., a corporation of Pennsylvania Filed Oct. 17, 1966, Ser. No. 587,057
Int. Cl. H01l 7/44
U.S. Cl. 148—187 10 Claims

ABSTRACT OF THE DISCLOSURE

Silicon dioxide is employed as a mask for the selective diffusion of a dopant material, selected from the group consisting of Group II and Group VI elements, into previously diffused regions of a body of semiconductor material of a compound of Group III and Group V elements.

This invention relates to the processing of semiconductor materials and more particularly to the masking of surfaces of bodies of semiconductor material comprising compounds of Group III and Group V elements to prevent diffusion through the masked surfaces of particular doping materials.

An object of this invention is to provide a process for masking surfaces of a body of semiconductor material comprising a compound of Group III and Group V elements to prevent diffusion of particular doping materials into the regions of the body embodying the masked surfaces.

Another object of this invention is to provide a process embodying the disposing of a layer of a first dopant material on a surface of a body of semiconductor material comprising a compound of Group III and Group V elements, diffusing a portion of the dopant material into the body and oxidizing a portion of the dopant material to form a suitable mask protecting the diffused portion of the body from being diffused by a second doping material.

Another object of this invention is to provide a process of disposing a layer of silicon on a surface of a body of semiconductor material comprising gallium phosphide, diffusing a portion of the silicon into the body to form a region of silicon doped gallium phosphide, oxidizing a portion of the remaining silicon to suitably mask the region of silicon doped gallium phosphide while a second dopant material zinc is diffused into the body to form a zinc doped region of gallium phosphide.

Other objects of the invention will, in part, be obvious and will, in part, appear hereinafter.

Figure 10:
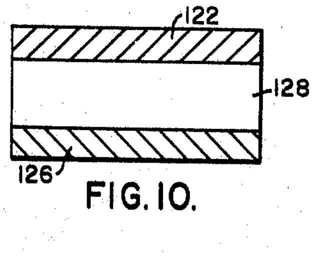
Figure 11:
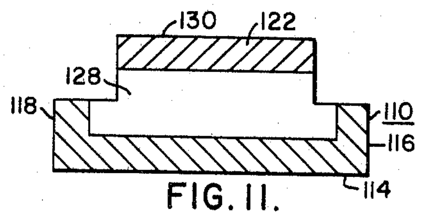
Figure 12:
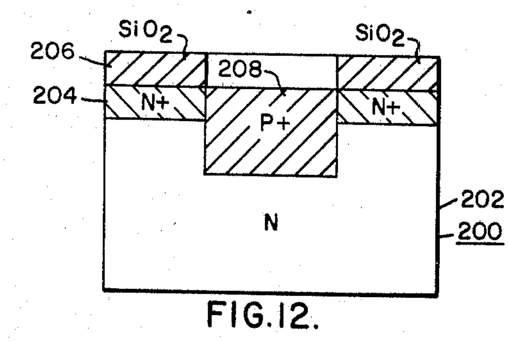

For a better understanding of the nature and objects of the present invention reference should be had to the following detailed description and drawings, in which:

FIGURES 1 through 7 inclusive are cross-sectional views of a body of semiconductor material being processed in accordance with the teachings of this invention;

FIGS. 8 through 11 are cross-sectional views of a body of semiconductor material being processed in accordance with the teachings of this invention; and FIG. 12 is a view, in cross-section, of an electrical device embodying the teachings of this invention.

In accordance with the present invention and in attainment of the foregoing objects, there is provided a process for diffusing a plurality of different type dopant materials into a body of semiconductor material comprising a compound of Group II and Group V elements, the steps comprising (1) disposing a layer of a first type dopant material on a surface of the body, (2) diffusing a portion of the first type dopant material into a first portion of the body of semiconductor material to form a first region of doped semiconductor material having a first type semiconductivity, (3) masking the first region of doped semiconductor material by depositing an additional layer of the first type of dopant material on the surface of the body and (4) diffusing a second type dopant material into an unmasked portion of the body to form a second region of doped semiconductor material having a second type semiconductivity.

Figure 1:
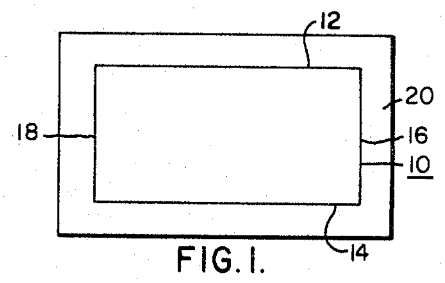

With reference to FIG. 1, there is shown a body 10 of semiconductor material. The body 10 has a top surface 12, a bottom surface 14 and side surfaces 16 and 18. The body 10 comprises a suitable semiconductor material compound of Group III and Group V elements such, for example, as gallium phosphide.

To more fully describe the teachings of this invention, and for no other purpose, the body 10 will be described as comprising gallium phosphide having a thickness of 7 mils.

A layer 20 of silicon is shown disposed on the surfaces 12, 14, 16 and 18 of the body 10. The layer 20 of silicon is obtained by any suitable means such, for example, as by vacuum evaporation of silicon onto the surface 12.

The layer 20 of silicon is from 1 to 20 microns in thickness. Preferably the layer 20 should be 2 microns or less. The layer 20 is preferred to be only approximately 2 microns in order to minimize the possibility of fracturing occurring along the interface at the surface 12 between the layer 20 and the body 10. The possibility of the occurrence of this fracturing occurs because of the different coefficient of expansion for each material.

The layer 20 of silicon need not cover the entire body 10. The body 10 is placed in a quartz capsule, evacuated to a pressure of $10^{-5}$ torr and sealed. The capsule is then placed in a furnace and heated to a temperature of from 850° C. to 1200° C. to diffuse a portion of the silicon from the layer 20, through the surfaces 12, 14, 16 and 18 and into the gallium phosphide comprising the body 10. The furnace dwell time at temperature varies from 4 to 90 hours. Under these conditions a layer 22 of silicon doped gallium phosphide ranging from 5 to 50 microns in thickness is produced.

Figure 2:
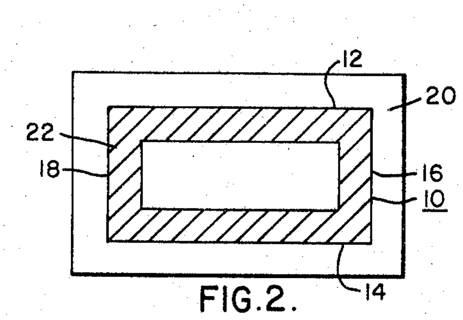

The structure of the body 10 after forming the layer 22, is shown in cross-section in FIG. 2.

The range of furnace temperature and time is sufficient to cause the decomposition of the compound gallium phosphide. To prevent the decomposition of gallium phosphide, enough phosphorus is placed in the furnace to keep the partial pressure of phosphorus in the closed system in equilibrium. In this manner the amount of phosphorus being released from the body 10 by the decomposition of the gallium phosphide is balanced by the amount of phosphorus entering the body 10 to combine with the recently produced gallium. The net effect of this continuous reaction is that the gallium phosphide apparently remains un-decomposed throughout the entire silicon diffusion process.

Figure 3:
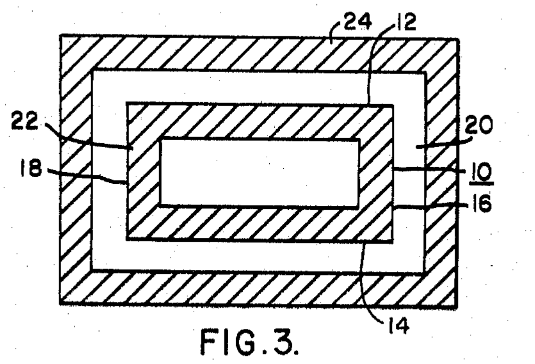

With reference to FIG. 3, there is shown the body 10 after a layer of silicon 24 has been disposed on the original silicon layer 20. The layer 24 is obtained by any suitable means, such, for example, as by vacuum evaporation of silicon onto the surface of the layer 20.

The layer 24 is less than one mil in thickness. The thickness of the layer 24 need only be as thick as what is necessary to form a suitable masking layer of silicon dioxide to prevent diffusion of unwanted dopant materials into the body 10 during subsequent processing. A thickness of 7,000 A. has been found suitable for achieving a proper masking layer of silicon dioxide subsequently.

The body 10, as shown in FIG. 3, is exposed to an oxidizing atmosphere to convert the layer 24 of silicon to silicon dioxide. A suitable process for oxidizing the layer 24 is first to heat the body 10 to approximately 1050° C. When the temperature of 1050° C. is reached, argon gas is caused to flow through water heated to 90° C. and then about the body 10. The flow is continued for 1 hour oxidizing silicon in the layer 24 to silicon dioxide.

Any oxidation or decomposition of the gallium phosphide which might occur in the surfaces 14, 16 and 18 of the body 10 is of no consequence and does not affect the final product achieved.

During the oxidation of the layer 24, a little more of the silicon of the layer 20 will also diffuse into the body 10 and the layer 22 will grow slightly. However, in most instances, the increase of the layer 22 will be insignificant.

An alternate method of obtaining a layer of silicon dioxide disposed on the layer 20 of silicon is to first dispose a layer of silicon monoxide on the layer 20 of silicon and then oxidize the monoxide to silicon to silicon dioxide.

Figure 4:
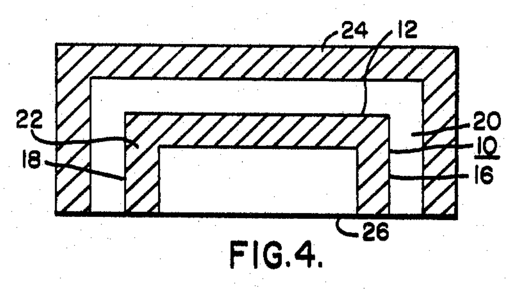

Referring to FIG. 4, the portion of each of the layers 20, 22 and 24 which have been formed in or on the body 10 have been removed from one major surface to reveal a new major surface 26. The portions are removed by such suitable means as lapping and polishing.

Figure 5:
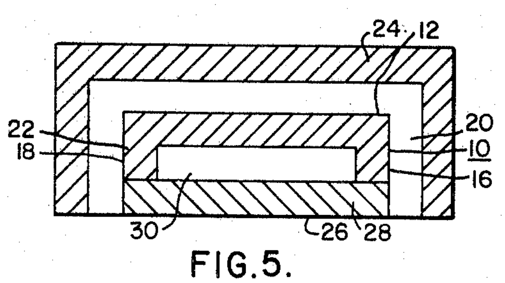

Referring to FIG. 5, the body 10 is shown after a diffusion process has formed a layer 28 of different type semiconductivity in the bottom portion of the body 10. A suitable material diffused into the body 10 to form the layer 28 is elemental zinc.

The body 10 is placed in a closed tube evacuated to a pressure of from $10^{-5}$ to $10^{-6}$ torr with a vaccum of $10^{-6}$ torr preferred along with a crucible containing zinc phosphide, and heated in a furnace to a temperature of from 850° C. to 1000° C. for a period up to approximately 90 hours. A temperature of 900° C.±5° C. is preferred. A furnace dwell time at 900° C.±5° C. of 64 hours will diffuse the zinc through the surface 26 and into the body 10 to a depth of from 3 to 5 mils.

During this zinc diffusion, the temperature of the process is high enough to cause the decomposition of the gallium phosphide. The presence of zinc phosphide in an adequate amount is sufficient to maintain in equilibrium the partial pressure of the phosphorus in the system. The net result is that the gallium phosphide comprising the body 10 is not decomposed during the zinc diffusion process.

A region 30 of undiffused gallium phosphide is enclosed by the diffused regions 22 and 26 within the body 10.

The layer 24 of silicon dioxide is removed from the body 10 by chemical etching means such, for example, as by dissolving the silicon dioxide in concentrated hydrofluoric acid. The diffused side surfaces 16 and 18 and the layer 20 of the remaining silicon are removed by suitable means such, for example, as by scribing and breaking them off, by chemical etching means or by utilizing ultrasonic equipment to cut them off.

Figure 6:
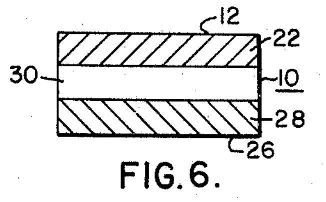

FIG. 6 is a cross-sectional view of the body 10 after unwanted layers of material have been removed.

Electrical contacts are then affixed to both the top surface 12 of the layer 22 and to the bottom surface 26 of the body 10. The electrical contacts may be disposed on the surfaces 12 and 26 by suitable means such, for example, as by vapor deposition and by the soldering of discs of an electrical contact metal to said surfaces. Both alloyed and ohmic electrical contacts may be affixed to said surfaces.

The process embodying the teachings of this invention will work equally as well for the diffusion of cadmium into bodies of semiconductor materials comprising a compound of Group III and Group V elements. The thin masking layer of silicon dioxide provides an excellent mask to prevent the cadmium from diffusing into any body comprising a semiconductor material comprising a compound of Group III and Group V elements.

The process described heretofore is also employed to mask surfaces of a body comprising a compound of Group III and Group V elements when Group II and Group VI elements are being diffused into the body.

An alternate method of processing the body 10 comprises the disposing of only one layer of silicon on the body 10. A portion of the silicon comprising the layer is diffused into the body 10 and a remaining portion of the silicon of the layer is converted to silicon dioxide to provide the necessary masking for a subsequent diffusion process.

Figure 7:
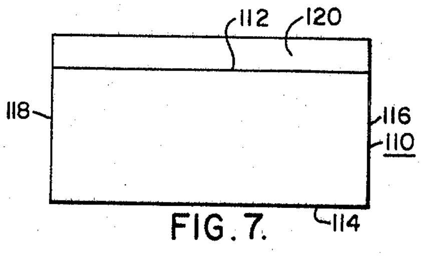

With reference to FIG. 7 there is shown a body 110 of semiconductor material. The body 110 has a top surface 112, a bottom surface 114 and side surfaces 116 and 118. The body 110 comprises the same semiconductor material as the body 10 described heretofore.

To more fully describe the alternate process embodying the teachings of this invention, and for no other purpose, the body 110 will be described as comprising gallium phosphide having a thickness of 7 mils.

A layer 120 of silicon is shown disposed on the surface 112 of the body 10. The layer 20 of silicon is obtained by any suitable means such, for example, as by vacuum evaporation of silicon onto the surface 12.

The layer 120 of silicon is from 1 to 20 microns in thickness. Preferably, the layer 120 should be 2 microns or less. The layer 120 is preferred to be only approximately 2 microns in order to minimize the possibility of fracturing occurring along the interface at the surface 112 between the layer 120 and the body 110. The possibility of the occurrence of this fracturing occurs because of the different coefficient of expansion for each material.

With the layer 120 of silicon disposed on the surface 112, the body 110 is placed in a quartz capsule, evacuated to a pressure of $10^{-5}$ torr and sealed. The capsule is then placed in a furnace and heated to a temperature of from 850° C. to 1200° C. to diffuse a portion of the silicon from the layer 120, through the surface 112 and into the gallium phosphide comprising the body 110. The furnace dwell time at temperature varies from 4 to 90 hours. Under these conditions a layer 122 of silicon doped gallium phosphide ranging from 5 to 50 microns in thickness is produced.

Figure 8:
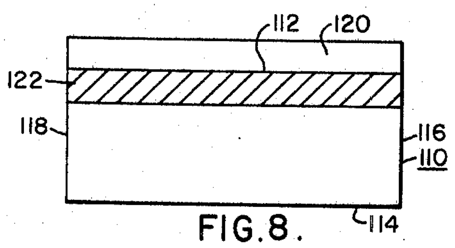

The structure of the body 110 after forming the layer 122 is shown in cross-section in FIG. 8.

The range of furnace temperature and time is sufficient to cause the decomposition of the compound gallium phosphide. To prevent the decomposition of gallium phosphite, enough phosphorus is placed in the furnace to keep the partial pressure of phosphorus in the closed system in equilibrium. In this manner the amount of phosphorus being released from the body 110 by the decomposition of the gallium phosphide is balanced by the amount of the phosphorus entering the body 110 to combine with the recently produced gallium. The net effect of this continuous reaction is that the gallium phosphide apparently remains un-decomposed throughout the entire silicon diffusion process.

The body 110, as shown in FIG. 8, is exposed to an oxidizing atmosphere to convert at least a portion of the remaining layer 120 of silicon to silicon dioxide. A suitable process for oxidizing the portion of the layer 120 is first to heat the body 10 to approximately 1050° C. When the temperature of 1050° C. is reached, argon gas is caused to flow through water heated to 90° C. and then about the body 110. The flow is continued for 1 hour oxidizing silicon in the layer 120 to silicon dioxide. If the layer 120 is of the order of 2 microns or less in thickness initially, usually all of the silicon remaining after the original silicon diffusion process will be oxidized to silicon dioxide.

Any oxidation or decomposition of the gallium phosphide which might occur in the surfaces 114, 116 and 118 of the body 110 is of no consequence and does not effect the final product achieved.

During the oxidation of the layer 120, a little more of the silicon of the layer 120 will also diffuse into the body 110 and the layer 122 will grow slightly. However, in most instances, the increase of the layer 122 will be significant.

Figure 9:
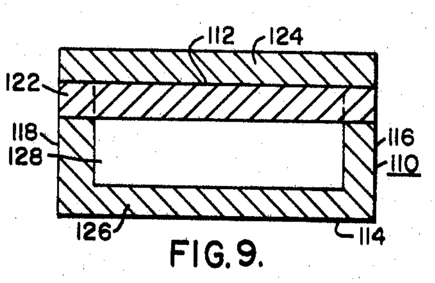

Referring to FIG. 9, the body 110 is shown after a diffusion process has formed a layer 126 of different type semiconductivity in the bottom portion of the body 110. A suitable material diffused into the body 110 comprising gallium phosphide to form the layer 126 is elemental zinc. Suitable means such, for example, as lapping and polishing and chemical etching are utilized to prepare the surface 114 of the body 110 for the diffusion process.

The body 110 is placed in a closed tube evacuated to a pressure of from $10^{-5}$ to $10^{-6}$ torr with a vacuum of $10^{-6}$ torr preferred, and heated in a furnace to a temperature of from 850° C. to 1000° C. for a period up to approximately 90 hours. A temperature of 900° C.±5° C. is preferred. A furnace dwell time at 900° C.±5° C. of 64 hours will diffuse the zinc through the surface 114 and into the body 110 to a depth of from 3 to 5 mils.

During this zinc diffusion, the temperature of the process is high enough to cause the decomposition of the gallium phosphide. The presence of zinc phosphide in an adequate amount is sufficient to maintain in equilibrium the partial pressure of the phosphorus in the system. The net result is that the gallium phosphide comprising the body 110 is not decomposed during the zinc diffusion process.

Elemental zinc will also diffuse into the side surfaces 116 and 118 of the body 110. However, the zinc diffused areas of the side surfaces 116 and 118 will be of no consequence in the resulting final product.

A region 28 of undiffused gallium phosphide is enclosed by the diffused regions 122 and 126 within the body 110.

The layer 124 of silicon dioxide is removed from the body 110 by chemical etching means such, for example, as by dissolving the silicon dioxide in concentrated hydrofluoric acid. The zinc diffused side surfaces 116 and 118 are removed by suitable means such, for example, as by scribing and breaking them off, by chemical etching means or by utilizing ultrasonic equipment to cut them off.

FIG. 10 is a cross-sectional view of the body 110 after the layer 124 of silicon dioxide and the zinc diffused side surfaces 116 and 118 have been removed.

The zinc diffused side surfaces 116 and 118 need not be removed from the body 110. The zinc diffused side areas can be isolated by fabricating a mesa type semiconductor device from the processed body 110.

After the layer 124 of silicon dioxide has been removed, the outer peripheral portion of the layer 122 of silicon doped gallium phosphide is removed, as well as an outer peripheral portion of the region 128 immediately adjacent to the layer 122 and that portion of the zinc diffused portions of the sides 116 and 118 immediately adjacent to the layer 122. The mesa type structure which is obtained is shown in FIG. 11.

Electrical contacts are then affixed to both a top surface 130 of the layer 122 and to the bottom surface 114 of the body 110. The electrical contacts may be disposed on the surfaces 120 and 114 by suitable means such, for example, as by vapor deposition and by the soldering of discs of an electrical contact metal to said surfaces. Both alloyed and ohmic electrical contacts may be affixed to said surfaces.

The process embodying the teachings of this invention will work equally as well for the diffusion of cadmium into bodies of semiconductor materials comprising a compound of Group III and Group V elements. The thin masking layer of silicon dioxide provides an excellent mask to prevent the cadmium from diffusing into any body comprising a semiconductor material comprising a compound of Group III and Group V elements.

The process described heretofore is also employed to mask surface of a body comprising a compound of Group III and Group V elements when Group II and Group VI elements are being diffused into the body.

The process described heretofore is suitable for producing planar devices. Sections of the masking material of silicon oxide of a body of semiconductive material are removed and diffusion of a suitable doping material through the unmasked surface into the body occurs. This establishes a new region of different type semiconductivity in the existing type of semiconductivity region of the body and the p-n junction between the two different type regions will be exposed in the surface through which the doping material is diffused.

With reference to FIG. 12, there is shown in cross-section a planar device 200 after diffusing zinc into the body of semiconductor material comprising the device 200.

The planar device 200 comprises a body 202 of gallium phosphide semiconductor material having an n-type semiconductivity. Employing silicon or preferably silicon monoxide a masking layer 206 of silicon dioxide is then formed on the body 202, openings made and zinc is diffused into the body 202 to form a region 208 of p+ type semiconductivity and the layer 206 of silicon prevents the zinc from diffusing into the remainder of the body 202. In the case in which silicon is used to form the silicon dioxide layer 206 a thin n+ layer 204 may be formed which can be removed by any suitable means such as etching. If silicon monoxide is used to form the silicon dioxide or if the silicon dioxide is formed by, for example, thermal decomposition of silane in the presence of oxygen, the n+ layer 204 would not be formed. Hence, these processes are preferable.

The following example is illustrative of the embodiments of the teachings of this invention:

EXAMPLE I

A wafer of semiconductor material comprising p-type gallium phosphide having a carrier concentration of about $2\times10^{17}$ cm.$^{-3}$ was prepared by suitable means for the vapor deposition of silicon on one surface of the major proportion. All other surfaces were suitably masked. The wafer after preparation measured 7 mils in thickness.

The wafer body was disposed in a vacuum evaporation chamber. A vacuum of $10^{-5}$ torr was established within the chamber. A layer of silicon was then evaporated onto at least the prepared major surface of the wafer. The silicon deposited on the wafer of gallium phosphide was approximately ½ mil in thickness. The vacuum was broken and the silicon coated wafer was renewed from the vacuum evaporated chamber.

The silicon coated wafer was then placed in a tubular quartz capsule. A crucible containing 85 milligrams of elemental phosphorus was also placed in the capsule. The tubular capsule was sealed at a vacuum of $10^{-5}$ torr. The capsule was placed in a furnace and heated to 1150° C. ±5° C. and retained at temperature for 90 hours to diffuse silicon into the wafer to form a region of n+ type semiconductivity. The furnace and its contacts were cooled to room temperature. The second layer of silicon was vapor deposited on the same side of the first silicon layer.

The silicon coated wafer of gallium phosphide was then placed in tubular furnace. The silicon coated wafer was then heated to 1050° C.± 10° C. Argon gas was bubbled through water heated to a temperature of 90° C. and then caused to flow over and about the silicon layer on the wafer to convert the silicon to silicon dioxide. The gas flow was continued for 1 hour at the elevated temperature. The furnace and its contents were cooled to room temperature and the silicon coated wafer removed. The major surface of the wafer on which no silicon layer was disposed was ground and polished to remove portions of the wafer which may have been contaminated by the previous process.

The wafer was then placed in a quartz capsu'e along with a crucible containing 85 milligrams of elemental phosphorous and a crucible containing 5 milligrams of zinc phosphide. The capsule was evacuated to $10^{-5}$ torr, sealed, placed in a furnace and heated at 900° C. ±5° C. for 64 hours to diffuse zinc into the wafer to form a region of p+ type semiconductivity. The furnace and its contents were then cooled to room temperature. The wafer was removed from the closed quartz capsule. The silicon oxide layer was removed from the one major surface by lapping. A layer of gold approximately 10 microns in thickness was disposed on each major surface of the wafer. The wafer was then placed in a vacuum furnace and a vacuum of $10^{-5}$ was established within the furnace. The wafer was heated to 500° C. ±5° C. to alloy the gold to the two major surfaces.

Grooves were then cut into the surface of the wafer in which silicon had been diffused. The grooves had a depth of from 3 to 4 mils which was sufficient to penetrate the silicon diffused region of the wafer. The grooves divided the wafer into individual p-n junction regions, or single diodes, measuring 10 mi s by 10 mils in size. The grooves also isolated the contaminated side surfaces of the wafer from the main portion of the wafer.

An electrical connection was then made to the individual diodes measuring 10 mils by 10 mils.

A thermoelectric type check of the region of the diodes immediately beneath where the layer of silicon dioxide had been formed showed it to have remained n-type while the measurement in the region of zinc diffused gallium phosphide indicated zinc had indeed been diffused.

Whi'e the invevntion has been described with reference to particular embodiments and examples, it will be understood, of course, that modifications, substitutions and the like may be made therein without departing from its scope.

What I claim as my invention is:

1. A process for diffusing a plurality of different type dopant materials into a body of semiconductor material comprising a compound of a Group III and phosphorous, the steps comprising (1) disposing a layer of a first type dopant material on a surface of the body, (2) diffusing a portion of the first type dopant material into a first portion of the body of semiconductor material to form a region or doped semiconductor material having a first type semiconductivity, (3) masking the region of doped semiconductor material by depositing an additional layer of the first type dopant material in the form of a dioxide on the surface of the body, and (4) diffusing a second type of dopant material into an unmasked portion of the body to form a second region of doped semiconductor material having a second type semiconductivity.

2. The process of claim 1 in which the first dopant material is silicon and the second dopant material is one selected from the group consisting of Group II and Group VI elements.

3. The process of claim 1 in which the first dopant material is silicon and the second dopant material is a material selected from the group consisting of zinc and cadmium.

4. The process of claim 1 in which the body of semiconductor material consists of gallium phosphide, the first dopant material is silicon and the second dopant material is a material selected from the group consisting of zinc and cadmium.

5. The process of claim 1 in which the body consists of gallium phosphide and the first dopant material is silicon, the silicon being disposed on one major surface of the body and having a thickness of from 1 to 20 microns, heating the body to a temperature of from 850° C. to 1200° C., maintaining the body at the elevated temperature from 4 to 16 hours, and diffusing zinc through an opposed major surface into the body of gallium phosphide at a temperature of 850° C. to 1000° C. for a period of up to approximately 90 hours.

6. The process of claim 1 in which the body comprises gallium phosphide and the first dopant material is silicon, the silicon being disposed on one major surface of the body and having a thickness of no more than two microns, heating the body to a temperature of 1150° C. ±5° C. for a period of 90 hours, oxidizing the remaining silicon for a period of 1 hour in an atmosphere of wet argon at a temperature of 1050° C.±10° C., and diffusing zinc through an opposed major surface into the body of gallium phosphide at a temperature of 950° C. ± 5° C. for a period of 64 hours.

7. A process for diffusing a plurality of different type dopant materials into a body of semiconductor materials comprising a compound of a Group III and phosphorus, the steps comprising (1) disposing a first layer of a first type dopant material on a surface of the body, (2) diffusing a portion of the first layer of the first type dopant material into a first portion of the body of semiconductor material to form a region of doped semiconductor material having a first type semiconductivity, (3) disposing a second layer of a material comprising the first type dopant material on the first layer of first type dopant material, (4) oxidizing the material of the second layer, and (5) diffusing a second type dopant material into a second portion of the body to form a second region of doped semiconductor material having a second type semiconductivity.

8. The process of claim 7 in which the first type dopant material is silicon and the second type dopant material is selected from a group consisting of zinc and cadmium.

9. The process of claim 7 in which the first type dopant material is silicon, the material comprising the second layer of the first type dopant material is silicon monoxide and the second type dopant material is selected from a group consisting of zinc and cadmium.

10. The process of claim 9 in which the semiconductor material comprising the body is gallium phosphide, the first type dopant material is silicon and the second type dopant material is selected from a group consisting of zinc and cadmium.

References Cited

UNITED STATES PATENTS

| | | | |
|---|---|---|---|
| 2,802,760 | 8/1957 | Derick et al. | 148—187 X |
| 2,846,340 | 8/1958 | Jenny | 148—189 X |
| 3,245,002 | 4/1966 | Hall. | |
| 3,255,056 | 6/1966 | Flatley et al. | 148—187 |
| 3,266,952 | 8/1966 | McCaldin | 148—190 X |
| 3,298,879 | 1/1967 | Scott et al. | 148—187 |
| 3,352,725 | 11/1967 | Antell | 148—186 |

L. DEWAYNE RUTLEDGE, Primary Examiner

R. A. LESTER, Assistant Examiner

U.S. Cl. X.R.

148—189, 190